United States Patent
Waldrop

(10) Patent No.: US 7,272,054 B2
(45) Date of Patent: Sep. 18, 2007

(54) TIME DOMAIN BRIDGING CIRCUITRY FOR USE IN DETERMINING OUTPUT ENABLE TIMING

(75) Inventor: Chad Waldrop, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 136 days.

(21) Appl. No.: 11/177,540

(22) Filed: Jul. 8, 2005

(65) Prior Publication Data

US 2007/0008758 A1    Jan. 11, 2007

(51) Int. Cl.
*G11C 7/00* (2006.01)
*G11C 8/00* (2006.01)

(52) U.S. Cl. .............. 365/191; 365/193; 365/194; 365/233; 365/230.08

(58) Field of Classification Search .......... 365/191, 365/193, 194, 230.06, 230.08, 233
See application file for complete search history.

(56) References Cited

U.S. PATENT DOCUMENTS

| | | | |
|---|---|---|---|
| 6,687,185 B1 | 2/2004 | Keeth et al. | 365/233 |
| 6,762,974 B1 | 7/2004 | Johnson et al. | 365/233 |
| 7,065,001 B2* | 6/2006 | Johnson et al. | 365/233 |
| 2005/0128828 A1* | 6/2005 | Lee | 365/194 |

OTHER PUBLICATIONS

Sang-Bo Lee et al., "A 1.6 Gb/s/pin Double-Data-Rate SDRAM With Wave-Pipelines CAS Latency Control," 2004 IEEE Int'l Solid State Conference § 11.6 (Feb. 17, 2004).
U.S. Appl. No. 10/910,838, filed Aug. 4, 2004, Johnson et al.

* cited by examiner

*Primary Examiner*—Amir Zarabian
*Assistant Examiner*—Michael Weinberg
(74) *Attorney, Agent, or Firm*—Wong, Cabello, Lutsch, Rutherford & Brucculeri, LLP

(57) ABSTRACT

A method and circuitry for alleviating the adverse effect of variable read decode propagation delays and variable output circuitry propagation delays on the read latency, and specifically for generating output enable signals at an appropriate time in light of such variable delays, is disclosed. In one embodiment, a first time domain as specified by an internal clock is delayed by the propagation delay of the read decoder block plus the propagation delay of the output circuitry via a model to create a second time domain which lags the first time domain. Processing in the second time domain associates the internal read command with a particular external clock cycle, and accounts for the specified read latency of the device. The output of such second time domain processing is a signal indicative of which external cycle should be used to enable the outputs. This signal is then converted back into the first timing domain by latches which lead the second timing domain.

29 Claims, 7 Drawing Sheets

US 7,272,054 B2

TIME DOMAIN BRIDGING CIRCUITRY FOR USE IN DETERMINING OUTPUT ENABLE TIMING

FIELD OF THE INVENTION

This invention relates to read synchronization in integrated circuit devices having a read latency, and is particularly but not exclusively useful in Synchronous Dynamic Random Access Memories (SDRAMs).

BACKGROUND

Synchronous Dynamic Random Access Memories (SDRAMs) are well known, and include such devices as Double Data Rate DRAMs (DDR DRAMs). In SDRAMs, and referring to FIG. 1A, data is written into and read out from the SDRAM 10 in synchronization with an external system clock signal (CLK). More specifically, when writing data to the array of cells 12 in the SDRAM 10, data is presented at the data lines (DQx) and at some discrete point during the clock's cycle—for example, on the clock's rising edge—this data enters the SDRAM 10 for eventual storage in the array 12 at an address specified by the address lines (Ax). Conversely, when reading data from the array 12, data is presented to the data lines (DQx) in accordance with the queried address on the address lines Ax, again at some discrete portion of the clock's cycle. Whether reading or writing is taking place is determined by the status of the row access strobe (RAS), column access strobe (CAS), chip select (CS), and write enable (W/E) signals (collectively, control signals 22) as is well known in DRAM technology. Ultimately these external control signals 22 are received from a system, such as a microprocessor system.

In an SDRAM, data can neither be written to nor read from the array 12 instantaneously. For example, it takes time for the data read from the array 12 to reach the data buffering circuit 19, which feeds data to the data lines DQx. For example, in a typical device, it takes approximately 15 nanoseconds (ns) for data to move from the array 12 and through the data buffering circuitry 19 to the data lines DQx when a read has been initiated. Thus, and referring to FIG. 1B, if the system clock signal CLK has a period (p) of 3 ns, and if a read request is specified at time T0 at a first address (addr 1), the data from that address will appear at the data lines DQx after five clock cycles at T5. Accordingly, the device is said to have a "read latency" (or Column Access Strobe (CAS) latency) of five clock cycles or just "five" for short. As is typical, particularly in DDR SDRAMs, the presentation of the data at the data lines will be preceded by the presentation of a data strobe signal DQS, which generally informs the microprocessor system to prepare for the data to be presented on the next cycle—what is known as the one cycle "read preamble." Hence, if the read latency is five, the DQS signal will issue one cycle before, or at cycle T4 in this example. Prior to the assertion of the DQS signal, the DQS is tri-stated.

The read latency for a given SDRAM and for a given external clock signal CLK period p is generally a parameter specified by the manufacturer of the SDRAM, and can generally be programmed by the user within some range. In any event, once the read latency was set, the read performance of SDRAMs in view of the read latency was generally predictable in the prior art. Because it was predictable, simple solutions were used for determining when to enable the transfer of the data and the data strobe from the data buffering circuit 19 to the output circuitry 20 (which includes the output latches or buffers 20), and when to enable (i.e., non-tri-state) the outputting of the data and data strobe from the output circuitry 20 to the data lines DQx. For example, output enable registers 14 were used between the decoder block 16 and the output circuitry 20 to clock the internal read signal (IR) through the registers to ultimately generate an output enable data signal (QED) and an output enable strobe signal (QES; which precedes QED by one cycle because of the read preamble). For example, if the read latency was six, then five output enable registers 14 would be used such that the internal read signal (IR), when clocked through, would generate a QED signal on the fifth clock cycle. This QED signal would then appear at the data buffering circuitry 19 and at the output circuitry 20 to start clocking the data to the data lines DQx at the sixth clock cycle. (Only five registers 14 would be needed as the output buffers 20 essentially comprise the sixth latch). A QES signal would likewise enable the issuance of the data strobe on line DQS on the fifth clock cycle.

Clocking of the output enable registers 14, the data buffering circuit 19, and the output circuitry 20 occurred in conjunction with an internal clock, DLLR, generated from the external clock CLK by a delay locked loop (DLL) circuit 18. Typically in the prior art, the internal clock DLLR was adjusted to lead the external clock CLK by the propagation delay of the output circuitry 20. In this way, when the outputs were enabled, the timing lead was subtracted by virtue of the delay, such that the data was output to data lines DQx (and the data strobe was output to line DQS) in synchronization with the external clock.

As clock times increase and as their periods p decrease, effects not noticeable at slower clock speeds are becoming apparent and significant, and make it difficult to read data out of an SDRAM with predictability and in accordance with the specified read latency. For example, consider assessment of the control signals 22 used (among other functions) to inform the device 10 to begin reading. This assessment requires decoding of the control signals 22 at decoder block 16, which ultimately outputs the internal read signal (IR) that informs the device that it is now in a read status. In the prior art, the time required to decode the control signals 22 (perhaps 2 ns) was small compared to the period p of the clock. Thus, it could be assured that the internal read command IR would issue within the same clock cycle that the read command was issued externally to the device via control signals 22.

By contrast, in current technologies and those on the near horizon, the time required to decode the control signals 22 at the decoder block 16 could take more than a single clock cycle, thus making the number of cycles between issuance of the external control signals 22 and generation of the internal read signal IR less predictable. Adding to this uncertainty, the propagation delay in the decoder block 16 is variable, and specifically can vary with changes in the Process used to form the device, the Voltage at which the device is operated, and the Temperature at which the device is operated (i.e., PVT variations). Thus, depending on the PVT conditions, generation of the internal read signal IR could take 1, 2 or 3 cycles, for example.

Furthermore, it is also important to note that the propagation delay of the output circuitry 20 (See FIGS. 1A and 3) is also subject to the same issue of variability. Therefore, depending on PVT variations and the clock cycle time, DLLR may also lead the external clock by one or more cycles, further complicating the problem of generating properly timed output enable signals.

Because these propagation delays can change in numbers of clock cycles, the number of fixed output enable registers 14 needed for proper alignment with the read latency would also need to change. It is thus becoming increasingly more difficult to use a fixed solution such as enablement of a fixed number of output enable registers 14. Simply put, given PVT variations, it is not certain how many output enable registers 14 would be needed at any particular time. As a result, read data cannot be provided at the output lines DQx with the accuracy required by the specified read latency.

Accordingly, the art would be benefited by a solution to this problem, and this disclosure provides such a solution.

SUMMARY

A method and circuitry for alleviating the adverse effect of variable read decode and output circuitry propagation delays on the read latency of a SDRAM, and specifically for generating output enable signals at the appropriate time in light of such variable delays, is disclosed. In one embodiment, an internal clock (DLLR) in a first time domain is delayed by a propagation delay equal to that of the read decoder block plus the output circuitry to create a second time domain which lags the first time domain by the amount of that summed propagation delay. The delayed internal read command output from the read decoder block is latched and tagged in the second time domain to a particular cycle (cyx) of the external clock, to produce a signal (RDx), where x specifies the clock cycle that an external read command was issued to the device, and where the number of RDx signals is equal to the maximum programmable read latency of the device. The RDx signal is then multiplexed in the second time domain with a signal indicative of the specified read latency (LAT<x>) to generate a signal (QES_outx) indicative of when the output strobe enable signal should be asserted. The QES_outx signals are then brought back into the first time domain by clocking a latch in the first time domain with a clock (DLLR) that leads by the output circuitry propagation delay to produce signals QES_startx, which correspond to QES. (The output data enable, QED, would then be issued one cycle later consistent with the one-clock-cycle read preamble). In this manner, variations in the propagation delay of the read decode and output circuitry are handled in a unique (second) timing domain, and then brought back into the first time domain, with the effect that the read latency of the SDRAM is not adversely affected should the read decode or output circuitry propagation delay potentially vary over a number of cycles.

BRIEF DESCRIPTION OF THE DRAWINGS

Embodiments of the inventive aspects of this disclosure will be best understood with reference to the following detailed description, when read in conjunction with the accompanying drawings, in which:

FIG. 4A illustrates the shifter circuit of FIG. 3, while

DETAILED DESCRIPTION

Figure 1A:
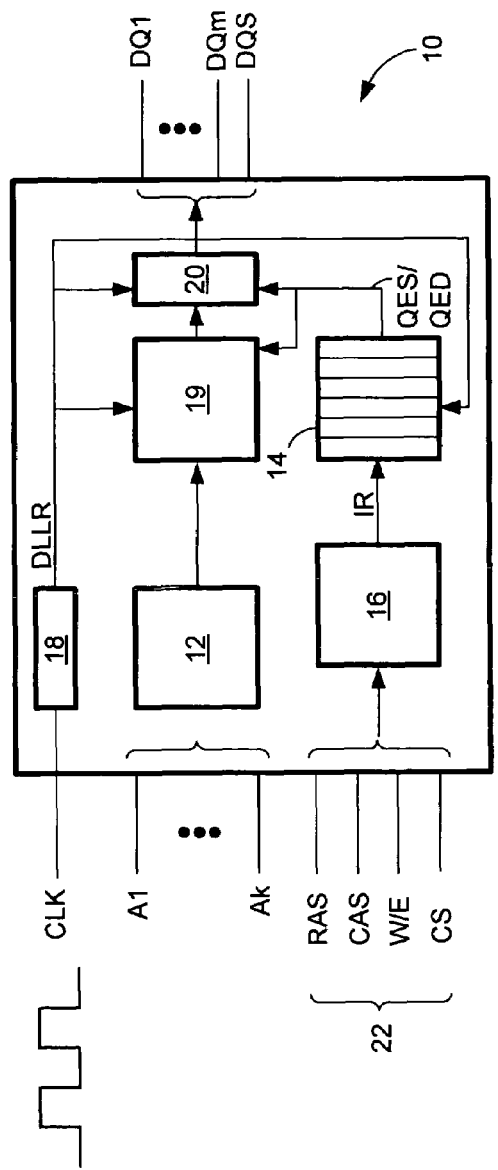
FIG. 1A illustrates a prior art SDRAM, and shows relevant circuitry blocks for generating output enable signals at specified read latency using a fixed solution.
Figure 1B:
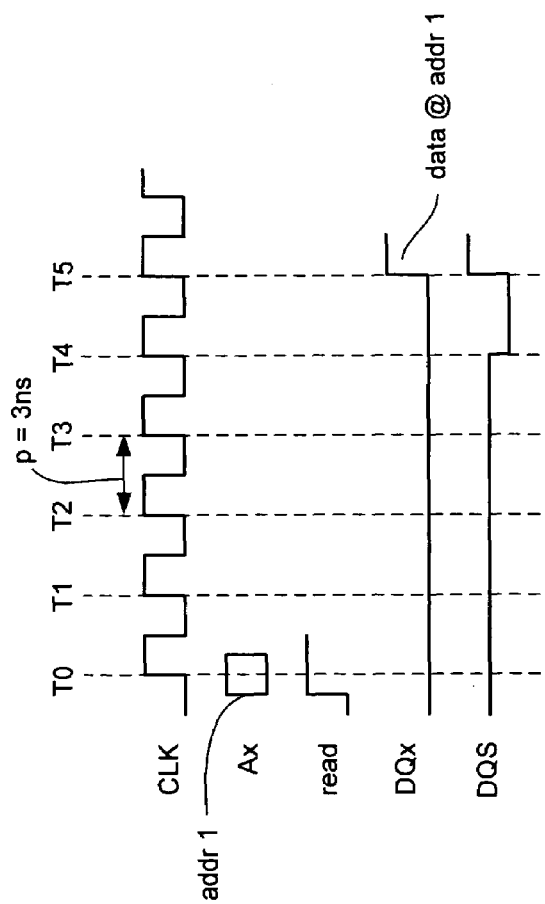
FIG. 1B illustrates a timing diagram to show the concept of read latency in a SDRAM.
Figure 2:
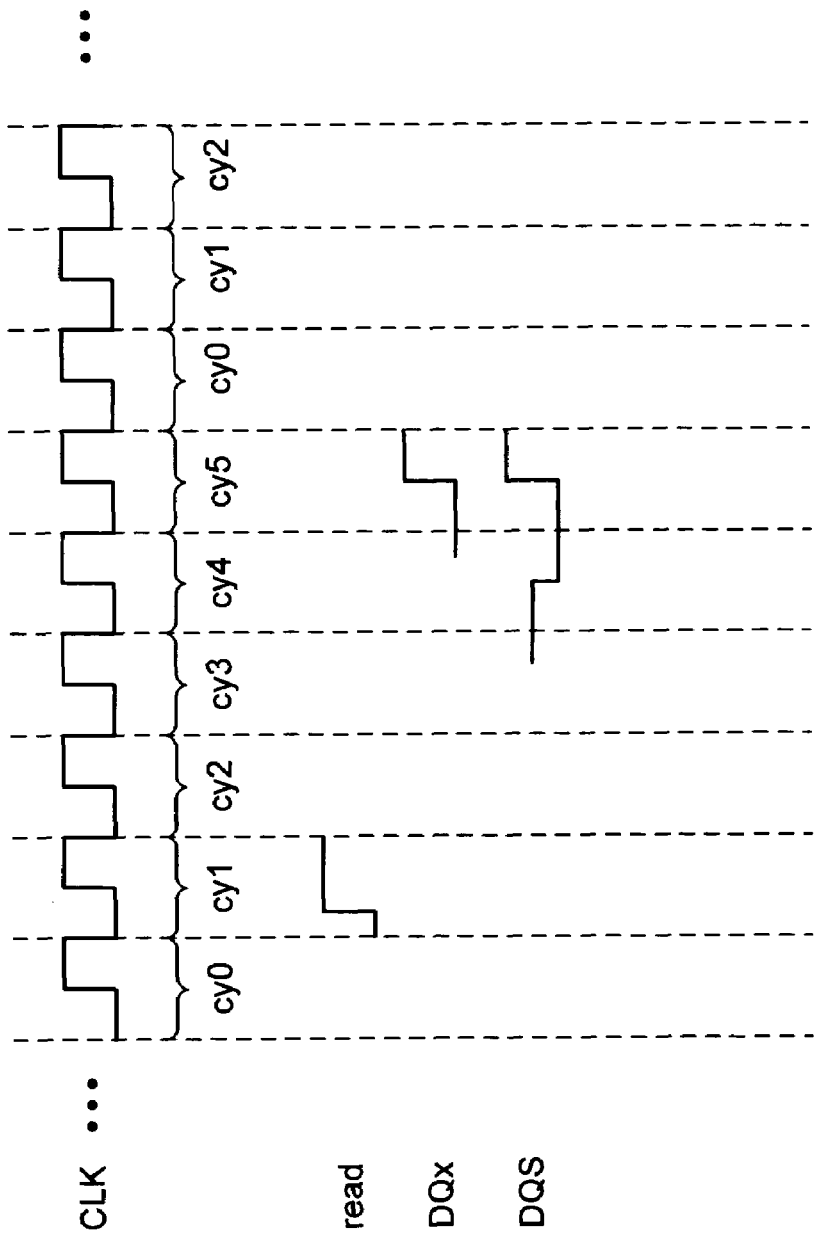
FIG. 2 illustrates how the invention treats the external clock as a series of sequential cycles, in which the number of cycles equals the maximum read latency of the device.

In one embodiment, the problem of PVT variations, and their adverse effects in knowing when to enable the output data in accordance with a specified read latency (i.e., issuance of QES/QED signals), is addressed first by generating signals (RDx) indicative of when an external read command was presented to the device at control signals 22. To first understand the relevance of the RDx signals, consider first how the technique treats the external clock, CLK, as illustrated in FIG. 2. As shown, an embodiment of the invention breaks the external clock cycle CLK into sequential singular cycles (cyx), with the number of cycles equaling the maximum read latency of the device. Thus, as shown, a first cycle of the external clock CLK is denoted as cy0, followed by cy1, etc. until cy5. After cy5, the next cycle is once again deemed to be cy0. All in all, the sequence of six cycles (cy0 through cy5) indicates a maximum read latency of six for the device. However, it should be noted that a maximum latency of six is merely illustrative and that larger or smaller maximum read latencies could be used.

Ultimately, which particular cycle of the external clock CLK is deemed as cy0 (the first cycle in the sequence) is random, and is transparent to the user of the device (and to the microprocessor system to which the device would be coupled). Regardless, should an external read command be issued at a cycle understood by the device as cy1 for example, and as shown in FIG. 2, a RD1 signal would be generated. If issued at cy5, signal RD5 would be generated, etc. The relevance of this will be appreciated later in this disclosure.

As noted earlier, part of the problem in making determinations about when a particular read command has been issued external to the device is that the decoding of this command can take a varying number of cycles. Accordingly, determining whether a particular read command issued on a first random cycle (cy0; RD0), the second cycle (cy1; RD1), etc. is a first point that this disclosure addresses because it provides the device a frame of reference.

Figure 3:
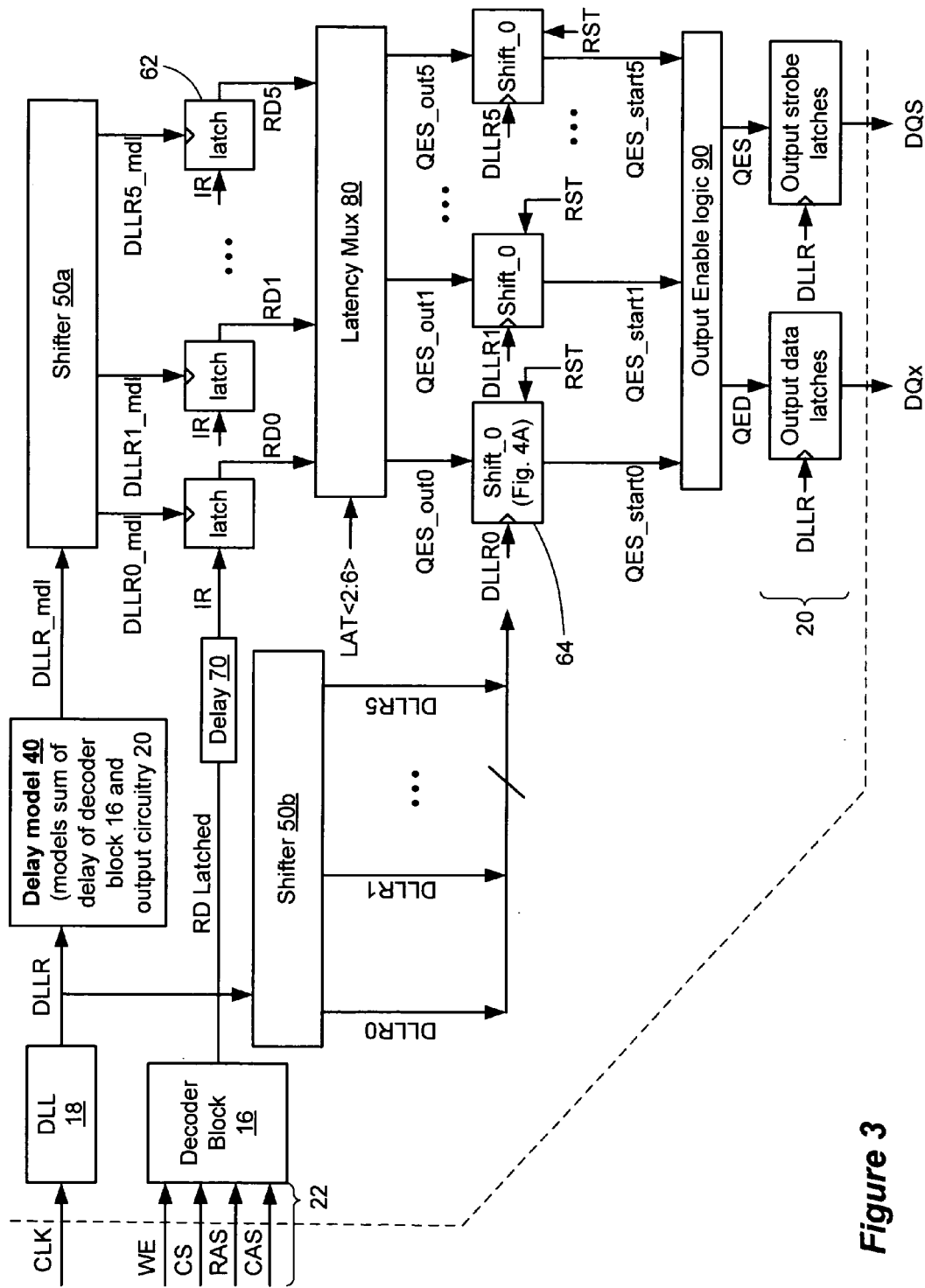
FIG. 3 illustrates an embodiment of the time domain bridging circuitry for generating output enable signals QES and QED in accordance with the invention.

As shown in FIG. 3, this determination is facilitated by generating the RDx signals in a (second) time domain different from the (first) time domain of the internal clock, DLLR. (In a preferred embodiment, DLLR leads the external clock CLK by the propagation delay of the output enable circuitry, for the reasons discussed in the Background.) Specifically, the RDx signals are generated in accordance with a clock DLLR_mdl, a clock signal generated from DLLR, but delayed therefrom via a delay model 40. As its name implies, delay model 40 models the delay of the decoder block 16 and the output circuitry 20, and in a preferred embodiment comprises use of a circuitry duplicative of the decoder block 16 and the output circuitry 20 so as to mimic their delays. It should be recognized that in duplicating the decoder block circuitry 16 and output circuitry 20 in the delay model 40 that certain obvious concessions would be made, such as tying off (i.e., to ground or power) various of the control signals 22 that otherwise would not be input to the delay model 40, etc. The circuitry for the decoder block 16, the output circuitry 20, and delay model 40 could comprise any number of well known circuits, and accordingly such circuitry is not shown for clarity.

Because the delay introduced by the delay model 40 models the propagation delay of the decoder block 16 plus the output circuitry 20, the DLLR_mdl clock and the internal read command IR are synchronized in the second time domain with respect to the external clock, CLK. This requires some explanation. Note that the internal read command IR is only delayed by the propagation delay in the decoder block 16; delays relating to the output enable circuitry 20 do not bear on IR. However, DLLR_mdl is preferably derived from a clock, DLLR, which takes into account the output circuitry 20 propagation delay; as noted, DLLR leads the external clock CLK by the amount of the output circuitry propagation delay. Thus, because a goal of the second time domain is to synchronize IR with a particular external clock cycle, affects relating to delays in the output enable circuitry should be negated and compensated for. Thus, to align the second timing domain (DLLR_mdl) with the external clock CLK, and hence IR, the delay model 40 preferably adds not only the delay of the decoder block 16 (necessary to align with IR, which is also delayed by the decoder block 16), but adds the delay of the output circuitry 20 to in effect subtract out the fact that DLLR (from which DLLR_mdl is derived) leads the external clock CLK by the output enable delay. In short, the effect of the delay model 40 is that the second time domain (as dictated by clock DLLR_mdl) is delayed only by the decoder delay 16 with respect to the external clock, CLK. As will be seen below, this makes it possible (via the RDx signals) to determine on which external clock cycle an external read command was issued. Moreover, because the circuitry used in the delay block 40 is similar to that used in the decoder block 16 and the output circuitry 20, any variable delays caused by PVT variations would be accounted for in the generation of DLLR_mdl, which would allow DLLR_mdl and IR to maintain a constant timing relationship to each other in the second timing domain.

Figure 4A:
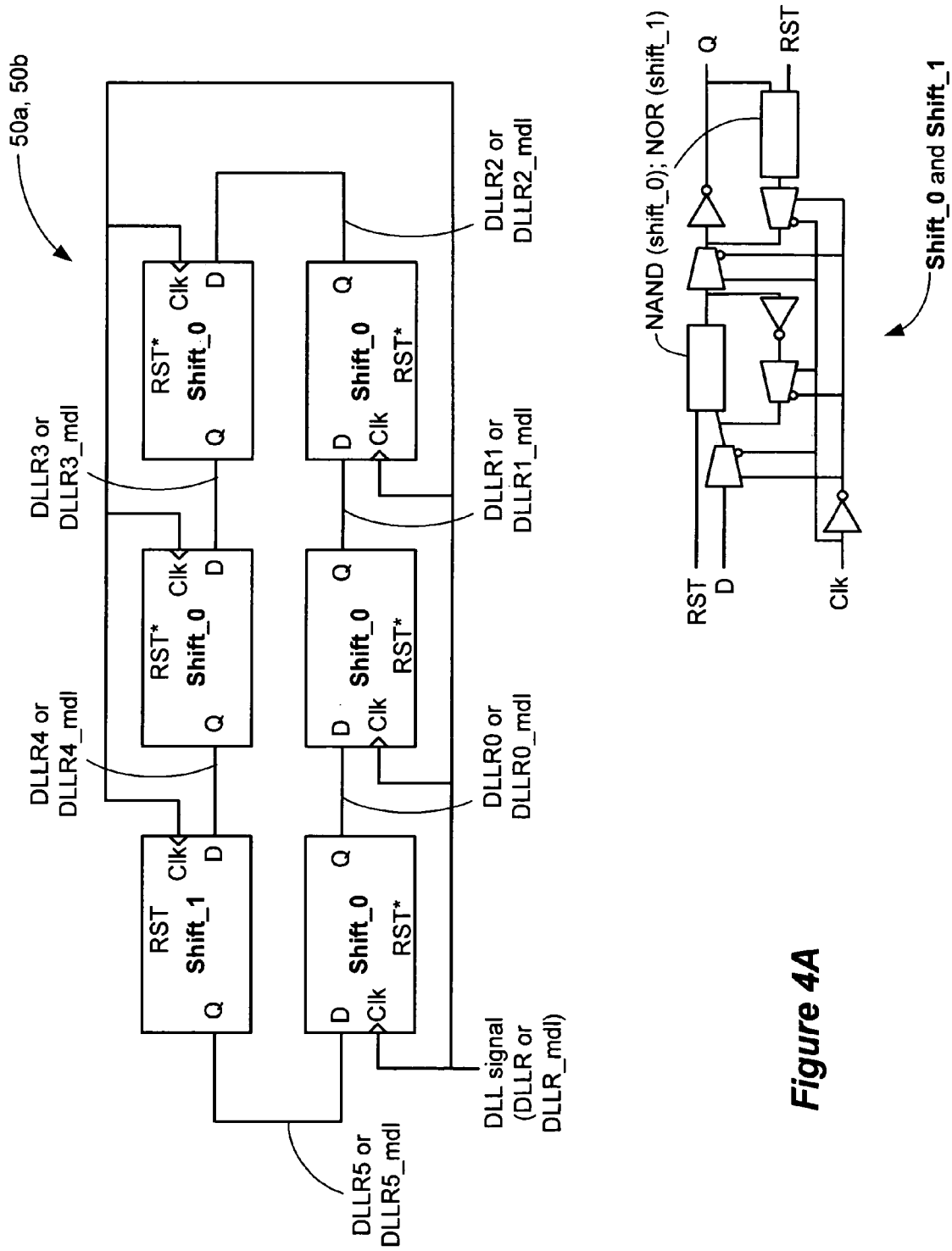

As shown in FIG. 3, internal clock DLLR_mdl is input to a shifter circuit 50a, which is shown in further detail in FIG. 4A. As one skilled in the art will understand, the shifter 50a is comprised of a ring of several latches (called Shift_0 and Shift_1), with the number of latches corresponding to the maximum read latency of the device, again six in the example. As mentioned earlier, the maximum read latency and the corresponding number of latches is merely illustrative, and could comprise numbers larger or smaller than six.

Figure 4B:
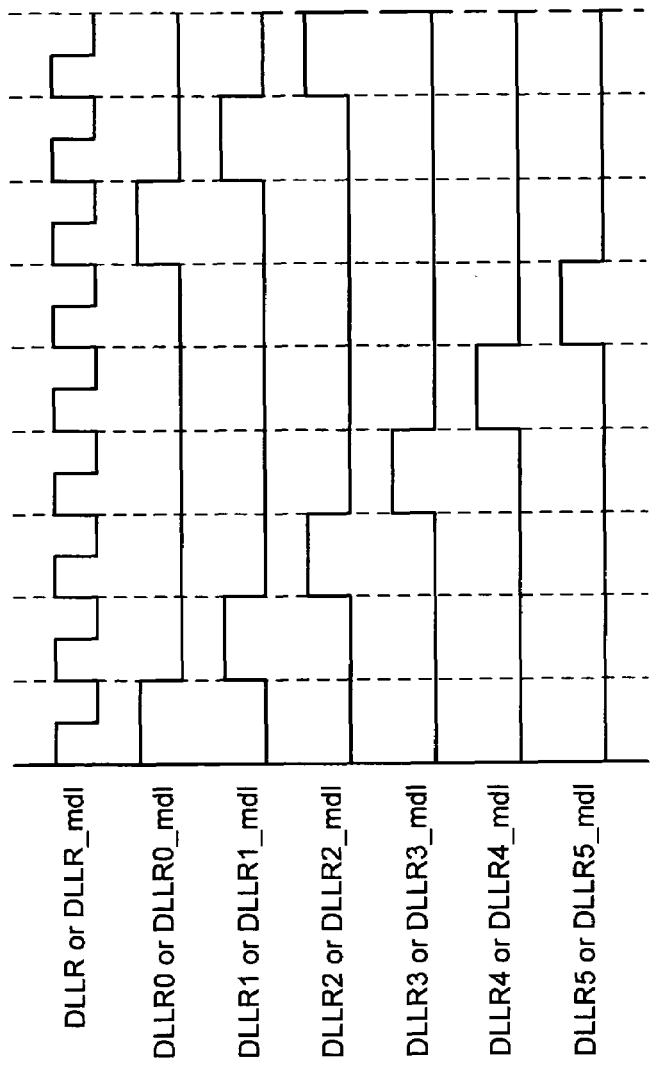
FIG. 4B illustrates the generation of clock signals of the shifter via a timing diagram.

Because one skilled in the art will understand how the shifter 50a operates, it is explained at a high level. Basically, the role of the shifter 50a is to take the input clock signal and to provide six clock signals (or as many clock signals as equals the number of latches), DLLR0_mdl through DLLR5_mdl, each of which is high for one cycle of the input clock, DLLR_mdl, and which are issued in sequence, as shown in FIG. 4B. As they are derived from DLLR_mdl, output clock signals DLLRx_mdl are in the same (second) time domain as the internal read command, IR.

Referring again to FIG. 3, it is seen that the internal read command IR is input to six latches 62, each of which is clocked by one of the output clock signals DLLRx_mdl. Each latch 62 in turn generates a signal RDx. As noted above, RDx comprises a signal which indicates the (random) clock cycle number (cy0 through cy5) on which the external read command was issued at control signals 22. Thus, and referring again to the example of FIG. 2, because the external assertion of a read command was issued at cycle cy1, signal RD 1 would be high, while all other RDx signals would be low. Again, because the shifter 50a runs continually, and essentially randomly picks a particular cycle as starting cycle cy0, the asserted RDx signal (RD1), is likewise random. However, the asserted RDx (RD1) signal indicates the device's understanding of when the read command was issued relative to a particular cycle (understood by the device as cy1). Moreover, as should be appreciated by this point, such external read information is captured in a second timing domain, and in a manner to compensate for PVT variations.

Figure 5:
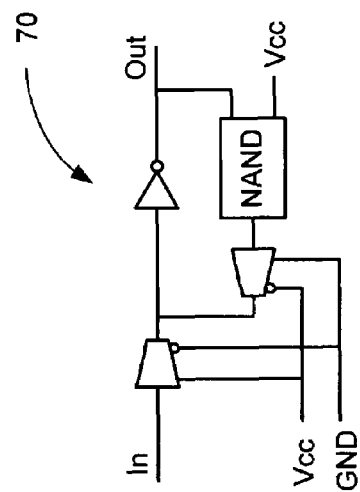
FIG. 5 illustrates a delay for synchronizing the internal read command with the output of the shifter of FIG. 4A.

While not necessary in all useful embodiments, a delay unit 70, shown in FIG. 3 and in detail in FIG. 5, is preferably used to slightly delay the internal read command as latched. Such slight delay is preferred to mimic the slight delay that the shifter 50a imparts to the delayed internal clock, DLLR_mdl, such that IR and the DLLRx_mdl clocks will be synchronized at the latches 62. Although delay 70 could comprise several different circuits, an exemplary circuit 70 is depicted in FIG. 5. Again, because operation of this circuit and its production of a slight delay is understood by one of ordinary skill in the art, delay circuit 70 is not explained further.

Figure 6:
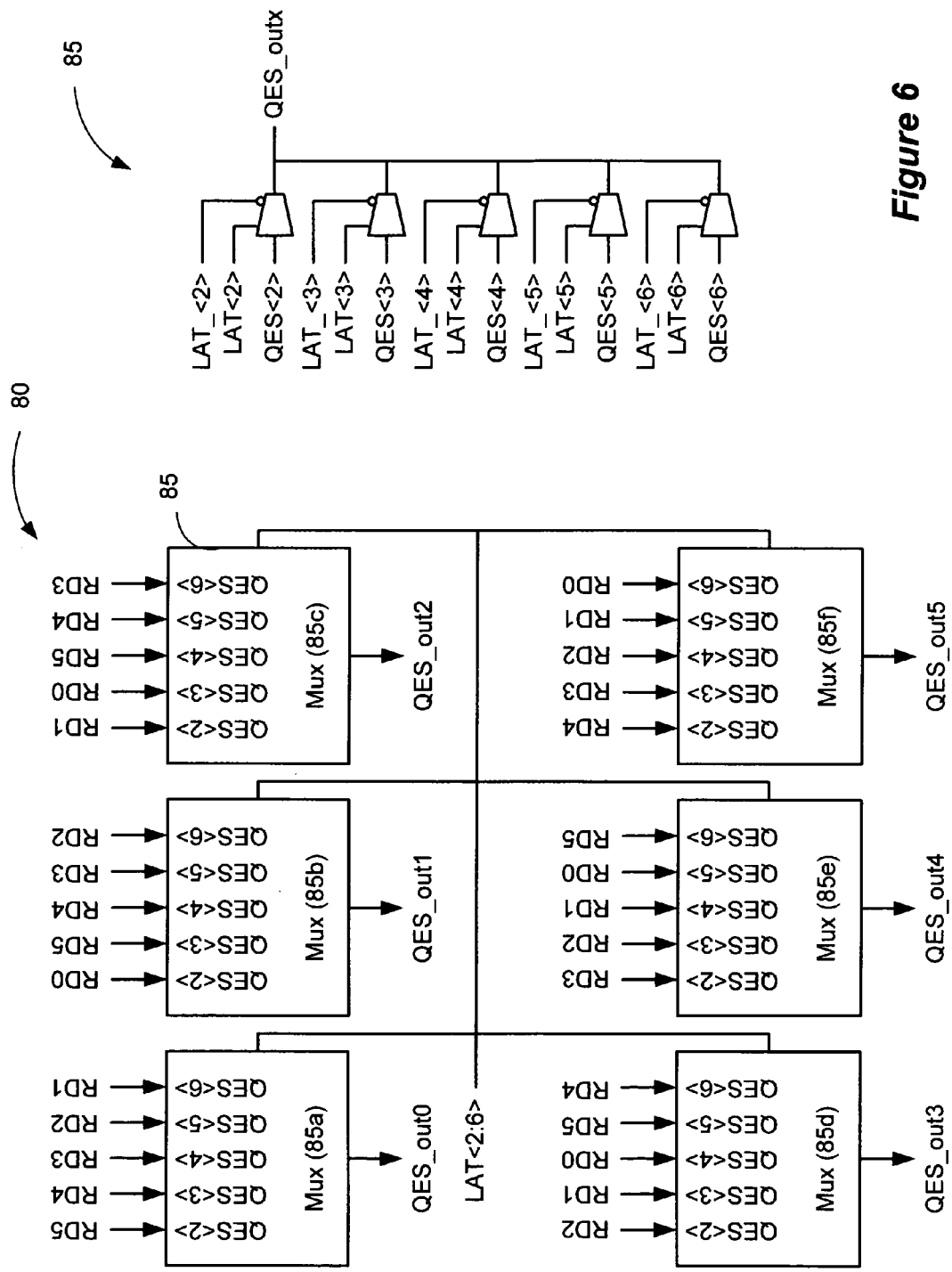
FIG. 6 illustrates the circuitry for the latency multiplexer block of FIG. 3.

Referring again to FIG. 3, the RDx signals are input to a latency multiplexer block 80, which as shown in FIG. 6 comprises six individual multiplexers 85 (again, a number consistent with the maximum read latency in the disclosed example, but which could be larger or smaller). At the latency multiplexer block 80, the device considers the active RDx signal indicative of the external issuance of the read command, and the read latency set for the device (via bus LAT<2:6>). The result is the output of a signal indicative of the cycle on which the output strobe enable signal (QES) should issue, i.e., QES_outx. In this regard, it should be remembered that the QES signal is asserted to output a data strobe DQS one cycle earlier than the QED is asserted to output data to the data lines DQx. Consider again the example of FIG. 2, in which the external read command occurs at cy1, and the read latency is four. In this example, data would be output on DQx at cy5, and the DQS strobe signal would be output a cycle earlier at cy4. Accordingly, and referring again to FIG. 6, these same conditions would cause QES_out4 to go high, indicating that QES should issue on what the device internally understands as cy4. Indeed, this is exactly what occurs in multiplexer 85e: because LAT<4>is high, the middle output (RD1) is chosen; because RD1 is high, QES_out4 is also high, while all other QES_outx signals are low. By cycling the inputs to the multiplexers 85x, other QES_outx signals can be asserted depending on which RDx signal is high and the set read latency LAT<x>of the device. In any event, through the generation of an active QES_outx signal, the device understands on what cycle (relative to an otherwise random cycle cy0 through cy5) the QES and QED signal should be asserted, with QED occurring one cycle later than the QES.

To this point in the circuit of FIG. 3, operation of the depicted circuitry (shifter 50a, latches 62, latency multiplexer 80) occurs in the second time domain (as dictated by the delayed clock DLLR_mdl), which is effectively lags the first time domain (as dictated by master clock DLLR) by the propagation delay of the decoder block 16 plus the propagation delay of the output enable circuitry 20 (via delay model 40). To ultimately output the data (via QED) and data strobe signal DQS (via QES), conversion must be made back to the first time domain, as dictated by DLLR. Such conversion occurs at latches 64 in FIG. 3. As shown, latches 64 are clocked in the first time domain by clocking signals DLLR0 through DLLR5. These clocking signals DLLRx are derived from first time domain clock DLLR and are generated by a shifter 50b, which is preferably identical to the shifter 50a discussed earlier, and which is depicted in FIGS. 4A and 4B. These clocking signals DLLRx are thus in the first time domain, and clock the latches at an appropriate time in the first timing domain. Thus, continuing the example above in which the read latency is four, RD1 is asserted, and QES_out4 is high, QES_out4 is clocked into its latch 64 by clock signal DLLR4. Because DLLR4 corresponds to the fourth random clock cycle (cy4), it is seen that the output from the latch, QES_start4, is asserted on that fourth cycle as it should be.

Figure 7:
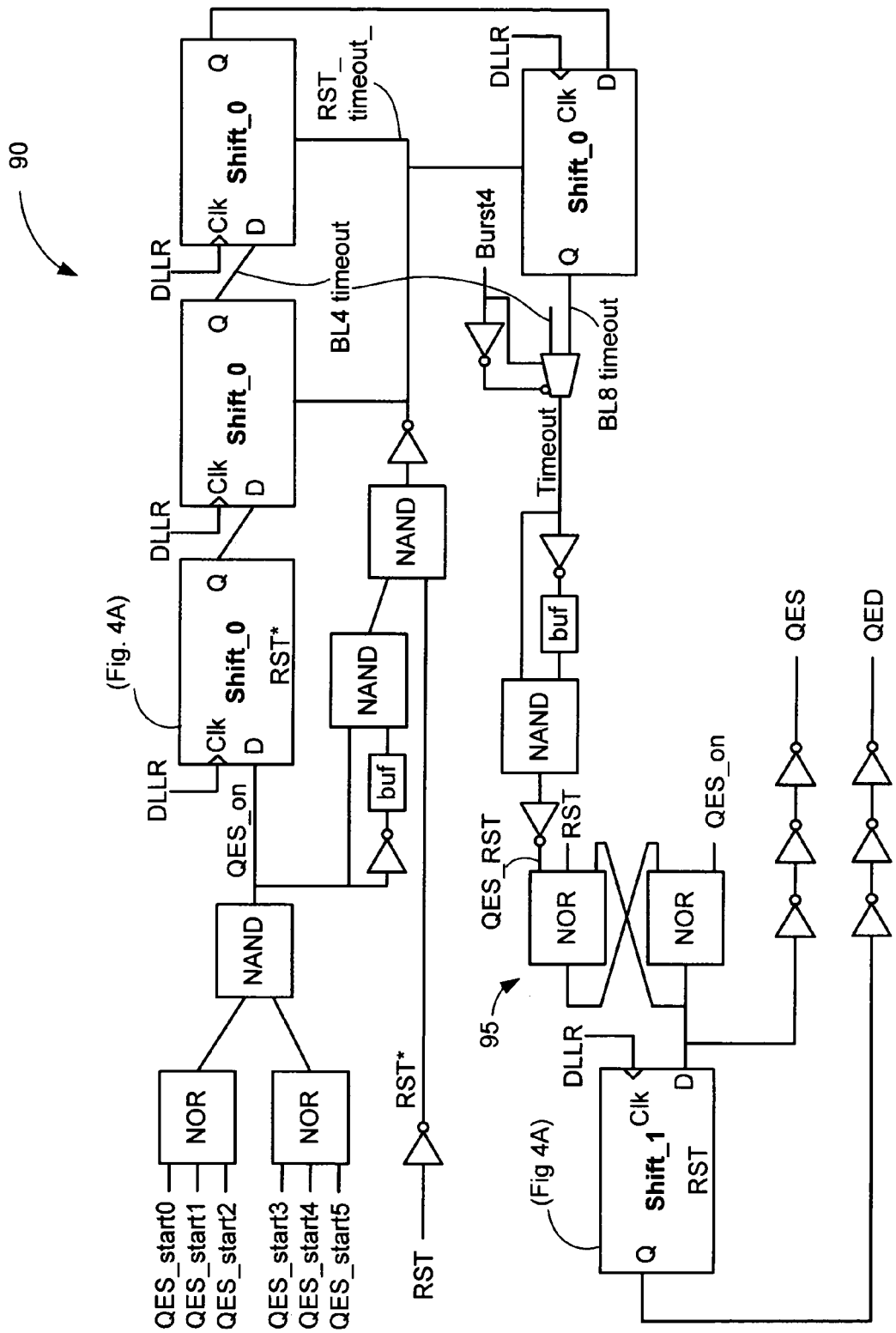
FIG. 7 illustrates the circuitry for the output enable logic block of FIG. 3.

Referring again to FIG. 3, the latched QES_startx signals are input to an output enable logic block 90, which is shown in further detail in FIG. 7. It will be noted in FIG. 7 that the assertion of any of the QES_startx signals will cause signal QES_on to go high, which in turn will pass through latch 95, which in turn generates QES. In short, assertion of any of signals QES_startx will basically immediately generate QES (and QED one cycle later as dictated by the Shift_1 block of FIG. 7). However, it should be remembered that any particular QES_startx signal will be generated at the appropriate time by its associated DLLRx clock signal at latches 64. In any event, once output enable logic 90 issues QES, and one cycle later QED, these signals are then used as in prior art to enable to the outputting of the data strobe and the data to their respective output lines DQS and DQx as is well known.

Other aspects of the output enable logic 90 of FIG. 7 relate to resetting of the circuitry in a typical DDR SDRAM with a programmable burst length. Because such resetting circuitry is not strictly required in all embodiments of the invention, and because the operation of the circuitry would be clear to one skilled in the art, it is only briefly explained. QES and QED, once generated, would need to be reset at the end of a reading burst, which is typically a burst length four or eight in a typical DDR SDRAM. Accordingly, FIG. 7 accounts for resetting through the generation of signal "Timeout," which will reset QES and QED at the proper times in accordance with the status of signal "Burst4" (high for a burst length of four, and low for a burst length of eight).

Although an embodiment of the invention is disclosed in the context of an SDRAM such as a DDR SDRAM, it should be understood that the techniques and circuitry disclosed herein could be used in different types of integrated circuits, such as PROMs, microprocessors or microcontrollers—basically in any integrated circuit benefiting from the type of synchronization disclosed. Moreover, while disclosed in the unique context of a DDR SDRAM having two output enable signals (QES and QED), it should be understood that the technique has benefit to devices having only a single output enable signal.

It should be understood that the inventive concepts disclosed herein are capable of many modifications. To the extent such modifications fall within the scope of the appended claims and their equivalents, they are intended to be covered by this patent.

What is claimed is:

1. A circuit for enabling output circuitry in an integrated circuit, comprising:
   a decoder block for issuing an internal read command from an external read command;
   a delay circuit for receiving a first clock in a first time domain and for outputting a second clock in a second time domain, wherein the second time domain lags the first time domain;
   processing circuitry operable in the second timing domain for receiving the internal read command, the second clock, and a read latency signal, and for generating an output signal indicative of a clock cycle at which an output enable signal is to issue; and
   latching circuitry operative in the first timing domain for receiving the output signal and issuing the output enable signal on the clock cycle.

2. The circuit of claim 1, wherein the decoder block comprises a circuit with a propagation delay, and wherein an output enable circuitry which receives the output enable signal comprises a propagation delay, and wherein the delay circuit models the two propagation delays in sequence.

3. The circuit of claim 2, wherein the second time domain lags the first domain by the two propagation delays.

4. The circuit of claim 1, wherein the processing circuitry comprises a clock shifter for splitting the second clock into a plurality of sequential clock signals, wherein each of the plurality of sequential clocks is used to generate a signal which when asserted indicates a clock cycle at which the external read command issued.

5. The circuit of claim 4, wherein the plurality of sequential clocks signals are each input into a latch having the internal read command as an input.

6. The circuit of claim 4, wherein the processing circuitry comprises a multiplexer for receiving each of the signals which when asserted indicate a clock cycle at which the external read command issued.

7. The circuit of claim 6, wherein the multiplexer further receives the read latency signal as an input.

8. The circuit of claim 1, further comprising a clock shifter for splitting the first clock into a plurality of sequential clock signals, wherein the latching circuitry receives the plurality of sequential clock signals.

9. A circuit for enabling output circuitry in an integrated circuit, comprising:
   a decoder block for receiving an external read command on a clock cycle and issuing an internal read command;
   a delay circuit for receiving a first clock in a first time domain and for outputting a second clock in a second time domain, wherein the second time domain lags the first time domain;
   an assessment circuitry for receiving the second clock and the internal read command and for asserting one of a plurality of signals indicative of the clock cycle on which the external read command was received;
   a multiplexer for receiving the plurality of signals indicative of the clock cycle on which the external read command was received and for receiving a read latency signal, and for asserting one of a plurality of signals indicative of a clock cycle at which an output enable signal is to issue; and
   latching circuitry operating in the first timing domain for receiving the plurality of signals indicative of the clock cycle at which an output enable signal is to issue, and for issuing the output enable signal on the second clock cycle.

10. The circuit of claim 9, wherein the decoder block comprises a circuit with a propagation delay, and wherein an output enable circuitry which receives the output enable signal comprises a propagation delay, and wherein the delay circuit models the two propagation delays in sequence.

11. The circuit of claim 10, wherein the second time domain lags the first domain by the two propagation delays.

12. The circuit of claim 9, wherein the assessment circuitry comprises a first clock shifter for splitting the second clock into a plurality of sequential clock signals, wherein each of the plurality of sequential clocks is used to clock a latch which receives the internal read command and outputs one of the plurality of signals indicative of the clock cycle on which the external read command was received.

13. The circuit of claim 12, wherein the first clock shifter comprises a ring of latches.

14. The circuit of claim 13, wherein the number of ringed latches equals the maximum read latency of the integrated circuit.

15. The circuit of claim 12, further comprising a second clock shifter for splitting the first clock into a plurality of sequential clock signals, wherein the latching circuitry receives the plurality of sequential clock signals.

16. The circuit of claim 9, wherein the output enable signal comprises an output strobe enable signal.

17. The circuit of claim 9, wherein the output enable signal comprises either an output strobe enable or an output data enable.

18. A method for enabling output circuitry in an integrated circuit, comprising:
   receiving an external read command at a first clock cycle;
   generating an internal read command from the external read command, wherein a first propagation delay exists between the external and internal read command;
   delaying a first clock signal by at least the first propagation delay to create a second clock signal;
   using the internal read command and the second clock signal to determine the first clock cycle;
   using the determined first clock cycle in conjunction with a read latency for the integrated circuit to determine a second clock cycle at which an output enable signal is to issue; and
   issuing the output enable signal on the second clock cycle in conjunction with timing specified by the first clock signal.

19. The method of claim 18, wherein the external read command comprises a plurality of concurrently asserted signals.

20. The method of claim 19, wherein the plurality of concurrently asserted signals comprise chip select, row access strobe, column access strobe, and chip select signals.

21. The method of claim 18, wherein determining the first clock cycle comprises a determination of one of a plurality of cycles, wherein a number of the plurality of cycles comprises a maximum read latency of the integrated circuit.

22. The method of claim 18, further comprising output circuitry for receiving the output enable signal, wherein the output circuitry comprises a second propagation delay, and wherein the first clock signal is delayed by the sum of the first and second propagation delays to create the second clock signal.

23. A method for enabling output circuitry in an integrated circuit having an internal clock operating in a first time domain, comprising:
   receiving an external read command;
   generating an internal read command from the external read command, wherein a first propagation delay exists between the external and internal read command;
   processing the internal read command and a read latency value set for the integrated circuit in a second time domain, wherein the second time domain lags the first time domain by at least the first propagation delay, and wherein the read latency value comprises a number of cycles; and
   issuing an output enable signal in the first time domain in accordance with the processed internal read command and latency value.

24. The method of claim 23, wherein the external read command comprises a plurality of concurrently asserted signals.

25. The method of claim 24, wherein generating the internal read command comprises decoding the plurality of concurrently asserted signals.

26. The method of claim 23, wherein the output enable signal comprises either an output data enable signal or an output strobe enable signal.

27. The method of claim 23, further comprising inputting a first clock in the first time domain into a delay circuit to generate a second clock in the second time domain.

28. The method of claim 27, wherein the integrated circuit comprises output circuitry for receiving the output enable signal with a second propagation delay, and wherein the second time domain lags the first time domain by a sum of the first propagation delay and the second propagation delay.

29. The method of claim 27, wherein each of the first and second clocks are respectively split into a first plurality of sequential clock signals and a second plurality of sequential clock signals, wherein processing the internal read command and the latency value comprises receipt of the second plurality of sequential clock signals, and wherein issuing the output enable signal comprises receipt of the first plurality of sequential clock signals.

* * * * *

UNITED STATES PATENT AND TRADEMARK OFFICE
CERTIFICATE OF CORRECTION

PATENT NO. : 7,272,054 B2
APPLICATION NO. : 11/177540
DATED : September 18, 2007
INVENTOR(S) : Waldrop It is certified that error appears in the above-identified patent and that said Letters Patent is hereby corrected as shown below:

On the title page, item (75), in "Inventor", in column 1, line 1, before "Chad" insert -- William --.

Signed and Sealed this

Twenty-seventh Day of November, 2007

JON W. DUDAS
*Director of the United States Patent and Trademark Office*